United States Patent
Tian (10) Patent No.: US 10,957,520 B2
(45) Date of Patent: Mar. 23, 2021

(54) LONG-LIFE HIGH-POWER TERMINALS FOR SUBSTRATE SUPPORT WITH EMBEDDED HEATING ELEMENTS

(71) Applicant: LAM RESEARCH CORPORATION, Fremont, CA (US)

(72) Inventor: Siyuan Tian, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 257 days.

(21) Appl. No.: 16/136,799

(22) Filed: Sep. 20, 2018

(65) Prior Publication Data
US 2020/0098551 A1  Mar. 26, 2020

(51) Int. Cl.
| H05K 7/12 | (2006.01) |
| H01J 37/32 | (2006.01) |
| H01L 21/67 | (2006.01) |
| H01L 21/687 | (2006.01) |

(52) U.S. Cl.
CPC .. *H01J 37/32724* (2013.01); *H01J 37/32458* (2013.01); *H01L 21/67103* (2013.01); *H01L 21/67248* (2013.01); *H01L 21/68757* (2013.01); *H01J 2237/3321* (2013.01); *H01J 2237/3341* (2013.01)

(58) Field of Classification Search
USPC ........................................................ 361/775
See application file for complete search history.

(56) References Cited

U.S. PATENT DOCUMENTS

| 2002/0036192 A1* | 3/2002 | Sato ...................... F02P 19/028 |
| | | 219/270 |
| 2002/0075624 A1 | 6/2002 | Wang et al. |
| 2012/0281334 A1 | 11/2012 | Sasaki et al. |
| 2014/0069585 A1 | 3/2014 | Aoto et al. |
| 2016/0168687 A1 | 6/2016 | Ramalingam et al. |
| 2017/0062260 A1 | 3/2017 | Cox et al. |
| 2017/0260616 A1* | 9/2017 | Lee ........................... C23C 4/04 |

OTHER PUBLICATIONS

International Search Report and Written Opinion dated Feb. 28, 2020 corresponding to International application No. PCT/US2019/051477, 11 pages.

* cited by examiner

*Primary Examiner* — Andargie M Aychillhum (57) ABSTRACT

A connection terminal for a heating element of a substrate support in a substrate processing system include a contact plate configured to be electrically connected to a contact pad of the heating element within a ceramic layer of the substrate support. A wire connection portion extends from the contact plate and is configured to receive and retain a wire arranged to provide electrical power to the heating element. At least one of the contact plate and the wire connection portion comprises a first material having a first coefficient of thermal expansion (CTE) that is within 20% of a second CTE of the ceramic layer.

19 Claims, 4 Drawing Sheets

LONG-LIFE HIGH-POWER TERMINALS FOR SUBSTRATE SUPPORT WITH EMBEDDED HEATING ELEMENTS

FIELD

The present disclosure relates to terminals of thermal control elements of a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a substrate. For example, the substrate may be clamped to the ceramic layer during processing. In some examples, a temperature of the substrate support (e.g., the ceramic layer) may be adjustable using thermal control elements.

SUMMARY

A connection terminal for a heating element of a substrate support in a substrate processing system include a contact plate configured to be electrically connected to a contact pad of the heating element within a ceramic layer of the substrate support. A wire connection portion extends from the contact plate and is configured to receive and retain a wire arranged to provide electrical power to the heating element. At least one of the contact plate and the wire connection portion includes a first material having a first coefficient of thermal expansion (CTE) that is within 20% of a second CTE of the ceramic layer.

In other features, the first CTE is within 5% of the second CTE. The first CTE is approximately 7.2 and the second CTE is approximately 7.1. Each of the contact plate and the wire connection portion includes the first material. The first material is a tungsten alloy. The first material is a tungsten-copper alloy. The first material is a tungsten-copper alloy comprised of approximately 85% tungsten and 15% copper. The first material is a tungsten-molybdenum alloy. The wire connection portion includes a vertical fin extending downward from the contact plate, and wherein the vertical fin includes an opening configured to receive the wire. The wire connection portion includes a cylindrical socket configured to receive the wire.

In other features, the contact plate includes the first material and the wire connection portion includes a second material having a third CTE within 20% of a fourth CTE of the wire. The first material is a tungsten alloy and the second material is copper. The contact plate and the wire connection portion are brazed together. The contact plate and the wire connection portion are brazed together using silver. The connection terminal further includes a plurality of spacers arranged on an upper contact surface of the contact plate.

A connection terminal for a heating element of a substrate support in a substrate processing system includes a contact plate configured to be electrically connected to a contact pad of the heating element within a ceramic layer of the substrate support. A wire connection portion extends from the contact plate and is configured to receive and retain a wire arranged to provide electrical power to the heating element. The connection terminal includes a functional-graded material (FGM) having a coefficient of thermal expansion (CTE) gradient from a ceramic-layer-side of the connection terminal to a wire-side of the connection terminal.

In other features, a CTE of the FGM increases from the ceramic-layer-side of the connection terminal to the wire-side of the connection terminal. The FGM includes a first CTE at the ceramic-layer-side of the connection terminal and a second CTE at the wire-side of the connection terminal, the first CTE is within 20% of a third CTE of the ceramic layer, and the second CTE is within 20% of a fourth CTE of the wire. The FGM includes tungsten and at least one of copper and molybdenum.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A substrate processing system may include a temperature controller connected to a plurality of heating elements, such as macro and/or micro thermal control elements (TCEs), arranged in a substrate support. For example, a plurality of TCEs may be arranged in a ceramic layer of the substrate support. A temperature controller controls the plurality of heating elements to adjust a temperature of the substrate support to control a temperature of a substrate arranged on the substrate support.

Wires provide current from an external power source to control the heating elements. For example only, the power source may correspond to a high current AC or DC power source (e.g., 5-10 kW for macro TCEs, 1-5 kW for micro TCEs, etc.). In some examples (e.g., for macro TCEs), the wires may be connected to respective heating elements using connection terminals and contact pads. In other examples (e.g., micro TCEs), the wires may be soldered directly to the contact pads of respective heating elements. For example only, the contact pads are arranged on and/or within a bottom surface of the ceramic.

The connection terminals provide an interface having a low electrical resistivity between the wires and the heating elements via the contact pads. In some examples, the connection terminals comprise copper, silver-plated copper, etc. The contact pads may be nickel-plated. Typically, the connection terminals are manually soldered to the contact pads and the wires are soldered into the connection terminals. The connections between the wires, the connection terminals, and the contact pads may be susceptible to various problems that cause failure and/or reduced reliability and lifetime of the substrate support.

For example, respective coefficients of thermal expansion (CTEs) of the connection terminals and the ceramic layer may differ. Accordingly, as the heating elements are heated to increase the temperature of the ceramic layer, the difference between the CTEs of the ceramic layer and the connection terminals stresses and fatigues the solder joints between the connection terminals and the contact pads and may cause cracking, delamination, and electrical open-circuit failures. Further, a contact interface between the connection terminals and the contact pads is substantially flat, making it difficult to achieve consistent solder thickness during manual soldering. Similarly, in examples where the wires (e.g., copper wires) are soldered directly to the contact pads, the difference between the CTEs of the ceramic layer and the wires causes stress and fatigue of the solder joints and associated failures.

Heating element connection terminals according to the principles of the present disclosure reduce stress in the solder joint between the connection terminals and the ceramic layer. For example, the connection terminals are configured to decrease the difference between the respective CTEs of the connection terminals and the ceramic layer. In one example, the connection terminals comprise a metal alloy material having a CTE that is tuned to the CTE of the ceramic layer. In another example, the connection terminals each include multiple portions (e.g., multiple portions brazed or bonded together) each comprising a metal having a different CTE. In still another example, the connection terminals comprise a functional graded material (FGM). In some examples, a contact interface between the connection terminals and the contact pads of the ceramic layer includes spacers configured to achieve a consistent solder thickness.

In this manner, the connection terminals according to the present disclosure reduce soldering joint stress and increase the reliability and overall lifetime of the substrate support (e.g., by a factor of 3-5). The principles of the present disclosure may also be implemented in other connections within the substrate processing system, including, but not limited to, an embedded RF Faraday shield grid, clamp electrodes, embedded temperature sensors, embedded substrate voltage sensors, etc.

Figure 1:
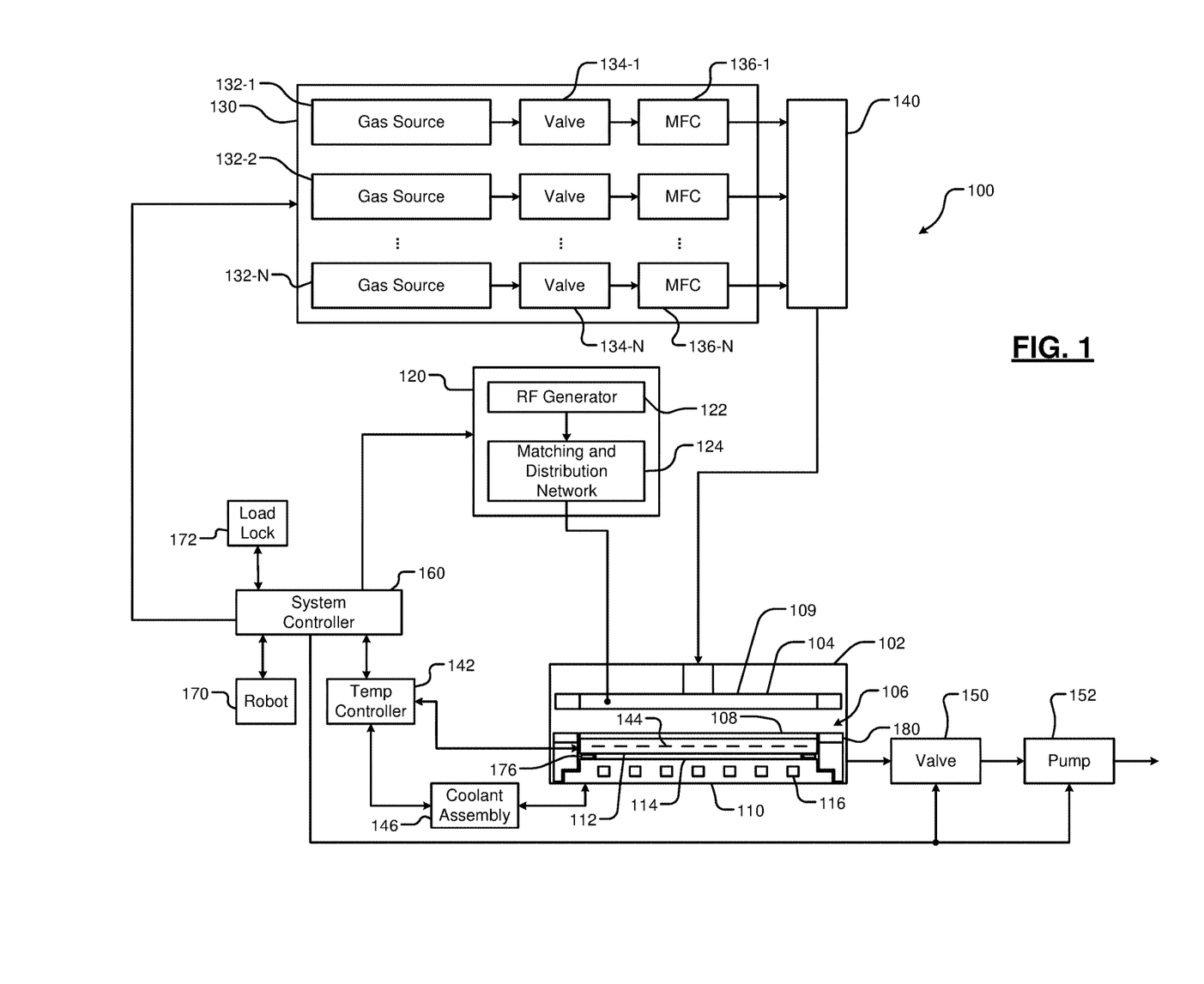
FIG. 1 is a functional block diagram of an example processing chamber according to the present disclosure.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements, such as thermal control elements (TCEs) 144 arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. Current is provided to the TCEs 144 to control the temperature of the substrate support 106 via connection terminals (not shown in FIG. 1) according to the principles of the present disclosure as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 may correspond to a top ring, which may be supported by a bottom ring 184. In some examples, the edge ring 180 may be further supported by one or more of a middle ring (not shown in FIG. 1), a stepped portion of the ceramic layer 112, etc. as described below in more detail. The edge ring 180 according to the principles of the present disclosure is moveable (e.g., moveable upward and downward in a vertical direction) relative to the substrate 108. For example, the edge ring 180 may be controlled via an actuator responsive to the system controller 160. In some examples, the edge ring 180 may be adjusted during substrate processing (i.e., the edge ring 180 may be a tunable edge ring). In other examples, the edge ring 180 may be removable (e.g., using the robot 170, via an airlock, while the processing chamber 102 is under vacuum). In still other examples, the edge ring 180 may be both tunable and removable.

Referring now to FIG. 2, an example substrate support 200 includes a baseplate 204 configured to support a ceramic layer 208. A thermal resistance layer 212 (e.g., a bond layer) may be arranged between the ceramic layer 208 and the baseplate 204. An edge seal 216 may be arranged to surround and protect the thermal resistance layer 212 from exposure to plasma and other process materials. The ceramic layer 208 is configured to support a substrate 220 during processing and an edge ring 224 surrounds the ceramic layer 208 and the substrate 220. In some examples, the baseplate 204 may include one or more coolant channels 228 for flowing coolant through the baseplate 204.

Figure 2A:
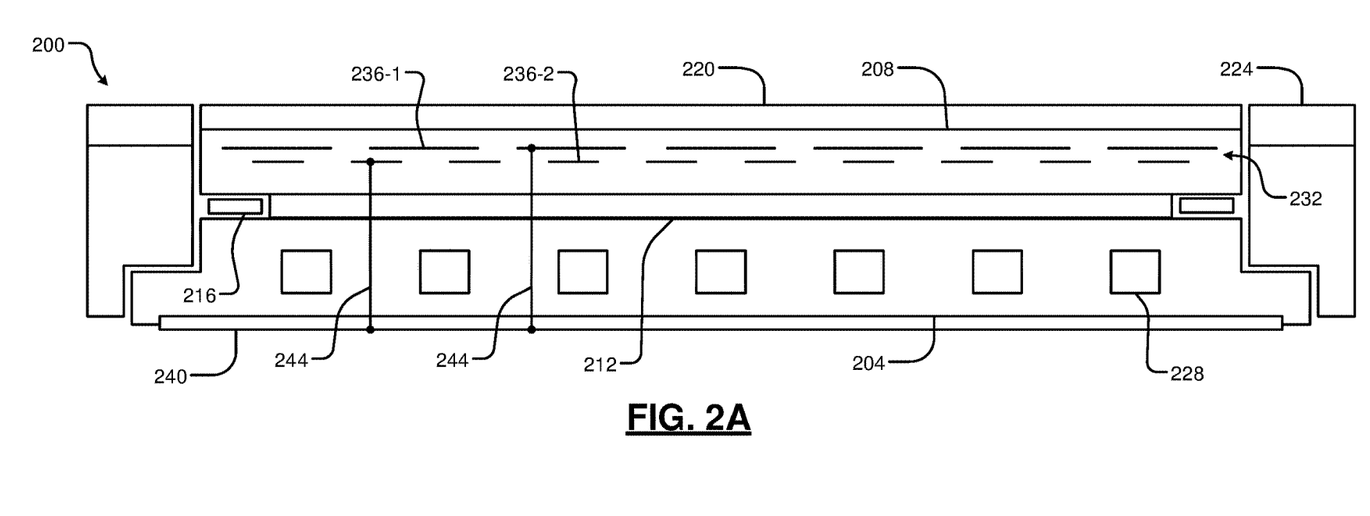
FIG. 2A is an example substrate support including connection terminals according to the principles of the present disclosure.

The ceramic layer 208 includes a heating layer 232. For example, the ceramic layer 208 may correspond to a multi-zone heating plate having an embedded heating layer. As shown, the heating layer 232 includes macro heating elements 236-1 and micro heating elements 236-2, referred to collectively as heating elements 236. The macro heating elements 236-1 correspond to respective zones of the ceramic layer 208. Accordingly, the macro heating elements 236-1 may be individually controlled to control temperatures of respective zones of the ceramic layer 208. Conversely, the micro heating elements 236-2 correspond to an array of heating elements distributed across multiple zones of the ceramic layer 208. The micro heating elements 236-2 may be individually controlled to control temperatures in specific locations within the ceramic layer 208, to compensate for temperature non-uniformities, etc.

Power (e.g., AC power, pulse width modulated DC power, etc.) is provided to the heating elements 236 from a circuit board (e.g., a distribution board) 240 that is embedded within or adjacent to a bottom surface of the baseplate 204 via wires 244. For example, first ends (e.g., input ends) of the wires 244 are soldered to the circuit board 240. Conversely, second ends (e.g., output ends) of the wires 244 are soldered directly or indirectly to the heating elements 236 within the ceramic layer 208 as described below in more detail.

Figure 2B:
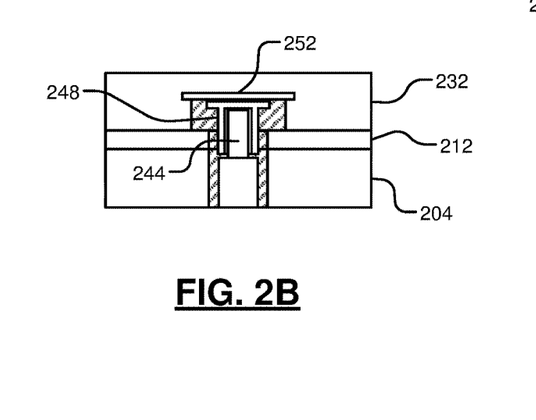
FIGS. 2B, 2C, and 2D are example connection terminals.
Figure 2C:
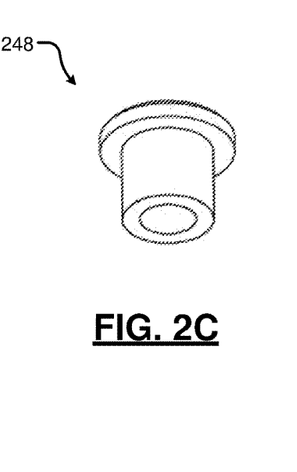
Figure 2D:
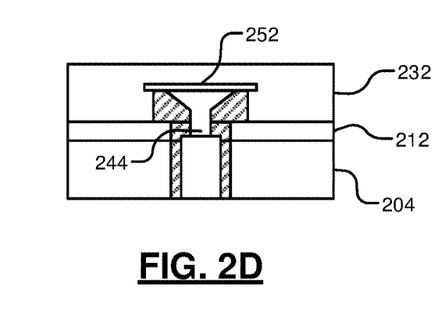

In some examples, the wires 244 may be soldered within a connection terminal 248 as shown in FIGS. 2B and 2C. The connection terminal 248 is in turn soldered to a contact pad 252 of a respective one of the heating elements 236 within the heating layer 232. For example only, the wire 244 as shown in FIG. 2B is soldered to the contact pad 252 of one of the macro heating elements 236-1 using the connection terminal 248. Conversely, in other examples, the wires 244 are soldered directly to the contact pad 252 as shown in FIG. 2D. For example only, the wire 244 as shown in FIG. 2D is soldered directly to the contact pad 252 of one of the micro heating elements 236-2 without using one of the connection terminals 248.

In the examples of FIGS. 2B, 2C, and 2D, the ceramic layer 208, the wires 244, the connection terminals 248, the contact pads 252, etc. have different CTEs and therefore expand and contract at different rates in response to changes in temperature of the ceramic layer 208 during operation (e.g., as a result of controlling the temperature of the ceramic layer 208 using the heating elements 236). For example, a CTE of the ceramic layer 208 may be relatively low as compared to CTEs of the wires 244, the connection terminals 248, and the solder material. Accordingly, changes in temperature cause stress and fatigue of the solder material, eventually leading to cracking of the solder material and disconnection of the wires 244 and/or the connection terminals 248 from the contact pads 252.

Figure 3A:
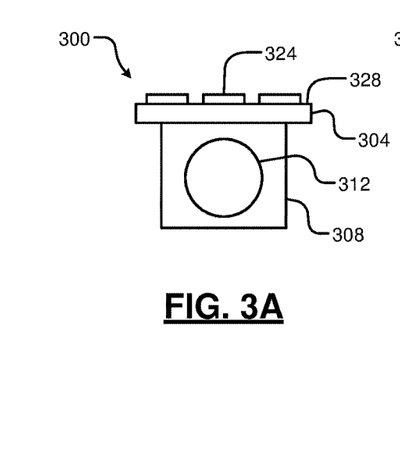
FIGS. 3A, 3B, 3C, 3D, and 3E show an example connection terminal according to the present disclosure.
Figure 3B:
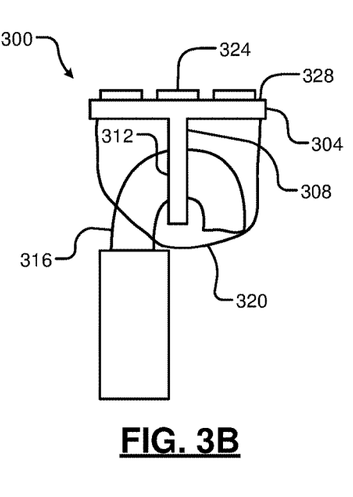

Referring now to FIGS. 3A, 3B, 3C, 3D, and 3E, an example connection terminal 300 according to present disclosure is shown. The connection terminal 300 includes a contact plate 304 and a wire connection portion (e.g., a vertical fin) 308. The contact plate 304 is generally planar and may be circular (as shown), ovate, rectangular, etc. As shown, the wire connection portion 308 extends in a direction perpendicular to a plane defined by the contact plate 304 and includes a through hole or opening 312. The opening 312 (which may be circular, as shown) is arranged to receive an end of a wire 316 as shown in FIG. 3B. In some examples, the wire 316 may be crimped within the opening 312. Solder 320 is applied to retain the wire 316 within the opening 312 and electrically connect the wire 316 to the connection terminal 300.

The connection terminal 300 includes one or more standoffs or spacers (e.g., protrusions) 324 arranged on an upper contact surface 328 of the contact plate 304. For example, in the examples shown in FIGS. 2B and 2C, a contact interface between the connection terminals 248 and the contact pads 252 is substantially flat, making it difficult to achieve consistent solder thickness during manual soldering. Non-uniform solder thickness may cause inadequate electrical connection between the connection terminals 248 and the contact pads 252, tilting of the connection terminals 248 relative to the contact pads 252, a solder joint that is too thick or too thin, etc. The spacers 324 according to the principles of the present disclosure ensure a uniform, desired thickness of a solder joint 332 between the contact surface 328 and a contact pad 336 as shown in FIG. 3E. For example, a height of the spacers 324 determines a thickness of a gap 340 between the contact surface 328 and the contact pad 336. For example only, the solder 320 and/or the solder joint 332 comprise tin, sliver, a tin-silver alloy, etc.

The connection terminal 300 is comprised of a material configured with a CTE that is tuned to match (e.g., within 20%) a CTE of ceramic layer 344. In some examples, the CTE of the connection terminal 300 is tuned to be within 5% of the CTE of the ceramic layer 344. For example, as shown in FIGS. 2A, 2B, 2C, and 2D, the ceramic layer 208 may be comprised of an alumina material, such as 99% or more of aluminum oxide ($Al_2O_3$), and has a CTE of approximately 7.1 (e.g., +/−0.5). Conversely, the wire 244 and the connection terminals 248 typically are comprised of nearly 100% copper (Cu), which has a CTE of approximately 17.2 (e.g., +/−0.5). Accordingly, changes in temperature of the ceramic layer 208 cause significantly different expansion rates in the ceramic layer 208 and the connection terminals 248 leading to solder joint failure. In contrast, the connection terminal 300 according to the principles of the present disclosure has a CTE that more closely matches (e.g., within 20%) the CTE of the ceramic layer 344. In some examples, the CTE of the connection terminal 300 is tuned to be within 5% of the CTE of the ceramic layer 344.

For example, the connection terminal 300 comprises a copper-tungsten (Cu—W) alloy having a CTE of approximately 7.2 (e.g., +/−0.5). For example only, the connection terminal 300 comprises approximately 85% (e.g., +/−5%) tungsten and 15% (e.g., +/−5%) copper. In one example, the Cu—W alloy comprises copper melted into a porous tungsten matrix structure. The ratio of tungsten to copper in the alloy may be selected to achieve a desired electrical conductivity, thermal conductivity, surface plating and solderability characteristics, and machinability. Further, the alloy is non-magnetic. In other examples, the connection terminal 300 comprises a W-molybdenum (Mo) alloy having a CTE of approximately 7.2 (e.g., +/−0.5). In this manner, a difference between the thermal expansion of the ceramic layer 344 and the connection terminal 300 is minimized. In some examples, the connection terminal 300 may be plated (e.g., using nickel plating instead of silver plating) to minimize inter-metallic growth. For example, the nickel plating may have a thickness of 5.0-10 μm.

Accordingly, as shown in FIG. 3E, the connection terminal 300 is soldered to the contact pad 336 with the solder joint 332 having a desired uniform thickness as determined by the spacers 324. The wire 316 is routed through baseplate 348 and bond layer 352 and crimped and soldered within the opening 312 of the wire connection portion 308. Since the difference between the CTEs of the ceramic layer 344 and the connection terminal 300 is minimized as described above, the solder 320 and the solder joint 332 are exposed to less stress caused by thermal expansion. Further, since the wire 316 is crimped within the opening 312, the electrical connection between the wire 316 and the connection terminal 300 may be maintained in the event of failure of the solder 320. In this manner, a lifetime of the connection terminal 300, and therefore a lifetime of the substrate support, is increased significantly.

Figure 3C:
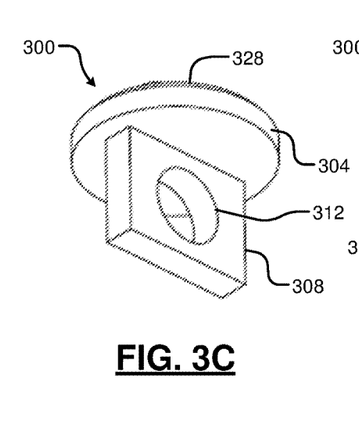
Figure 3D:
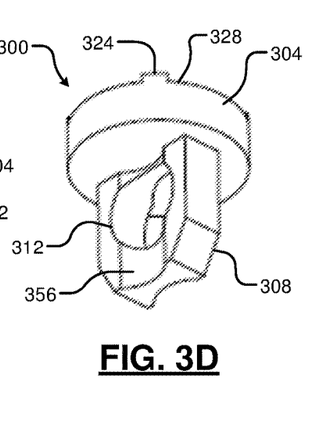
Figure 3E:
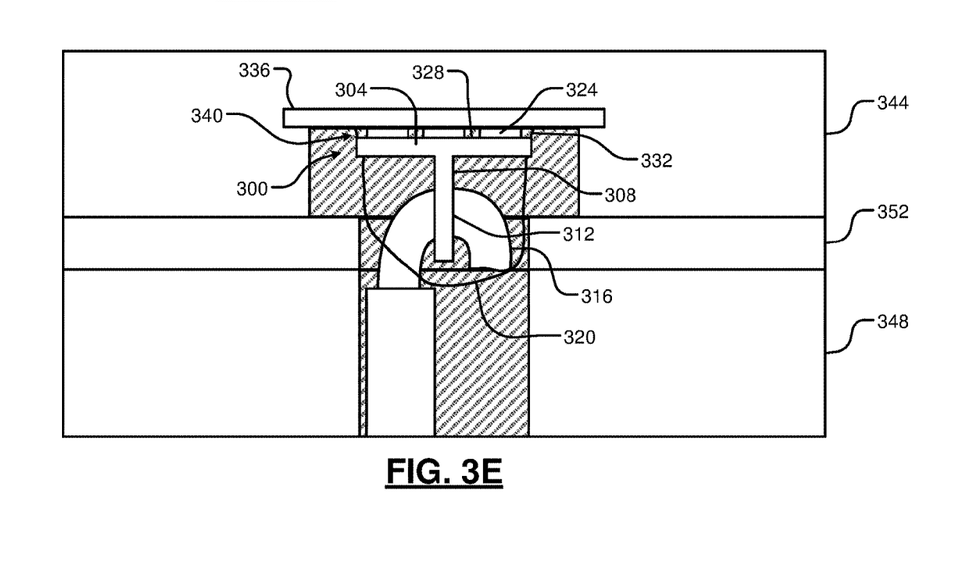

FIG. 3C shows one example of the connection terminal 300. For example only, the connection terminal 300 of FIG. 3C may be configured for connection to the macro heating elements 236-1. Conversely, the connection terminal 300 of FIG. 3D may be configured for connection to the micro heating elements 236-2. In this example, the connection terminal 300 of FIG. 3D may have reduced dimensions (e.g., a smaller opening 312, a wire connection portion 308 having a smaller width, a contact plate 304 having a smaller diameter, etc.) relative to the connection terminal 300 of FIG. 3C. In some examples, the connection terminal 300 of FIG. 3D includes grooves 356 on sides of the wire connection portion 308 to allow for a tighter crimp of the wire 316 and, consequently, a reduced width of the solder 320. Accordingly, the substrate support 200 may include an array of the connection terminals 300 of FIG. 3C for connection to the macro heating elements 236-1 and an array of the connection terminals 300 of FIG. 3D for connection to the micro heating elements 236-2.

Figure 4A:
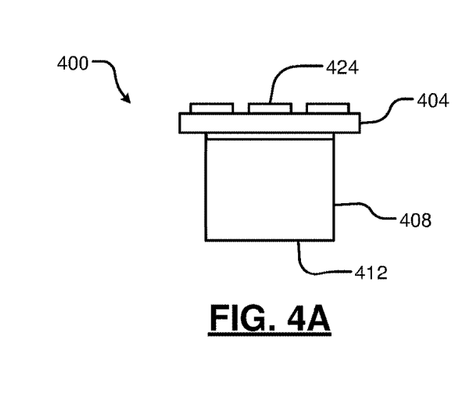
FIGS. 4A, 4B, and 4C show another example connection terminal according to the present disclosure.
Figure 4B:
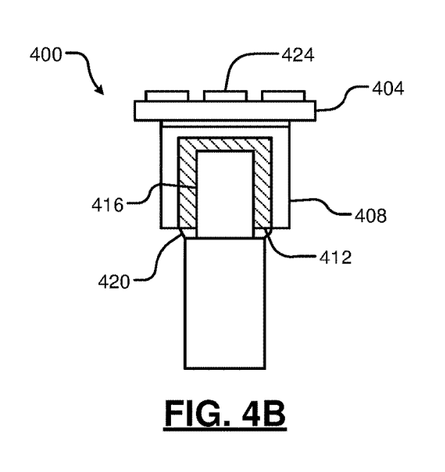
Figure 4C:
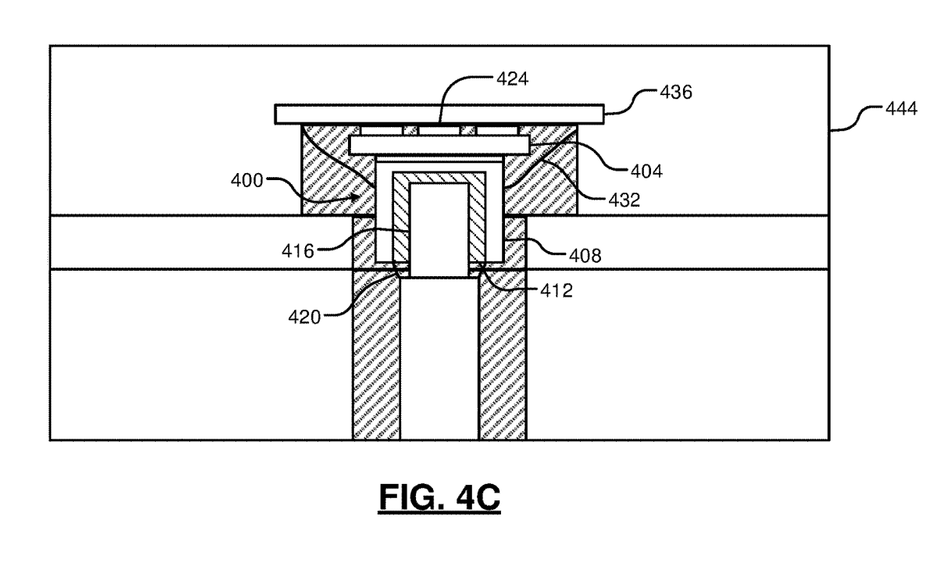

Referring now to FIGS. 4A, 4B, and 4C, another example connection terminal 400 according to present disclosure is shown. The connection terminal 400 includes a contact plate 404 and a wire connection portion (e.g., a cylindrical socket) 408. The contact plate 404 is generally planar and may be circular (as shown), ovate, rectangular, etc. As shown, the wire connection portion 408 extends in a direction perpendicular to a plane defined by the contact plate 404 and includes a downward-facing opening 412. The opening 412 (which may be circular, as shown) is arranged to receive an end of a wire 416 as shown in FIG. 4B. Solder 420 is applied to retain the wire 416 within the wire connection portion 408 and electrically connect the wire 416 to the connection terminal 400. In some examples, the wire connection portion 408 may be crimped closed around the wire 416.

The connection terminal 400 may include one or more standoffs or spacers (e.g., protrusions) 424 similar to the spacers 324 described above in FIG. 3A. The spacers 424 ensure a uniform, desired thickness of a portion of a solder joint 432 between the connection terminal 400 and a contact pad 436 as shown in FIG. 4C. For example only, the solder 420 and/or the solder joint 432 comprise tin, silver, a tin-silver alloy, etc.

The connection terminal 400 may comprise a bi-metal structure. For example, the contact plate 404 may comprise a first metal or metal alloy while the wire connection portion 408 comprises a second metal or metal alloy. The first metal and the second metal have different CTEs. For example, the first metal of the contact plate 404 has a first CTE selected to match (e.g., in some examples, within 20%, and, in other examples, within 5%) a CTE of ceramic layer 444. Conversely, the second metal of the wire connection portion 408 has a second CTE selected to match (e.g., in some examples, within 20%, and, in other examples, within 5%) a CTE of the wire 416.

In one example, the contact plate 404 comprises tungsten or a tungsten alloy (e.g., at least 85% tungsten and 15% or less of copper) and the wire connection portion comprises copper or a copper alloy (e.g., at least 85% copper and 15% or less of tungsten). Accordingly, the CTE of the contact plate 404 is less than the CTE of the wire connection portion 408 such that the CTE of the contact plate 404 more closely matches (e.g., in some examples, within 20%, and, in other examples, within 5%) the CTE of the ceramic layer 444 and the CTE of the wire connection portion 408 more closely matches (e.g., in some examples, within 20%, and, in other examples, within 5%) the CTE of the wire 416 (which may comprise 100% copper). Since the CTEs of respective contact surfaces of the contact plate 404 and the wire connection portion 408 more closely match the ceramic layer 444 and the wire 416, thermal expansion differences causing stress within the solder 420 and the solder joint 432 are further minimized.

The contact plate 404 and the wire connection portion 408 may be bonded together using a process such as sintering, brazing, etc. As shown, the contact plate 404 and the connection portion 408 are connected together using a brazing technique. For example, brazing is used to bond the contact plate 404 to the connection portion 408 with a brazing joint 448. For example only, the brazing joint 448 is comprised of silver (Ag) and has a thickness of 20-30 μm. In one example, the bi-metal structure may be formed first (e.g., by brazing a tungsten-copper alloy to copper using silver) and then machined into the connection terminal 400. In another example, the contact plate 404 and the wire connection portion 408 may be separately formed and machined and then brazed together. The entire connection terminal 400 may be nickel plated. In some examples, the contact plate 404 and the wire connection portion 408 are nickel plated prior to being brazed together. The connection terminal 400 including the silver brazing joint 448 may be nickel plated again subsequent to the brazing.

In another example, the connection terminal 400 may comprise a material having a CTE gradient (i.e., a CTE that decreases from a ceramic-layer-side to a wire-side of the connection terminal 400). For example, the connection terminal 400 may comprise a functional-graded material (FGM). In one example, the connection terminal 400 comprises a functionally-graded tungsten-copper material. A ratio of the tungsten to copper may decrease from the ceramic-layer-side to the wire-side of the connection terminal (e.g., from an 85-15 tungsten-copper ratio to a 100-0 copper-tungsten ratio. The functional-graded material may be formed first (e.g., as a block) and then machined into the connection terminal 400.

The principles described in the example of FIGS. 4A-4C may be applied to the connection terminal 300 of FIGS. 3A-3E. For example, the connection terminal 300 may comprise a bi-metal structure, a FGM structure, etc. Similarly, the wire connection portion 408 of the connection terminal 400 may be configured as a vertical fin including a through hole or opening 312 as described in FIGS. 3A-3E.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable end-point measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate support for a substrate processing system, the substrate support including a connection terminal for a heating element of the substrate support, the connection terminal comprising:
   a contact plate, wherein the contact plate is electrically connected to a contact pad of the heating element within a ceramic layer of the substrate support; and
   a wire connection portion extending from the contact plate, wherein the wire connection portion receives and retains a wire arranged to provide electrical power to the heating element,
   wherein at least one of the contact plate and the wire connection portion comprises a first material having a first coefficient of thermal expansion (CTE) that is within 20% of a second CTE of the ceramic layer.

2. The substrate support of claim 1, wherein the first CTE is within 5% of the second CTE.

3. The substrate support of claim 1, wherein the first CTE is approximately 7.2 and the second CTE is approximately 7.1.

4. The substrate support of claim 1, wherein each of the contact plate and the wire connection portion comprises the first material.

5. The substrate support of claim 1, wherein the first material is a tungsten alloy.

6. The substrate support of claim 1, wherein the first material is a tungsten-copper alloy.

7. The substrate support of claim 1, wherein the first material is a tungsten-copper alloy comprised of approximately 85% tungsten and 15% copper.

8. The substrate support of claim 1, wherein the first material is a tungsten-molybdenum alloy.

9. The substrate support of claim 1, wherein the wire connection portion comprises a vertical fin extending downward from the contact plate, and wherein the vertical fin includes an opening configured to receive the wire.

10. The substrate support of claim 1, wherein the wire connection portion comprises a cylindrical socket configured to receive the wire.

11. The substrate support of claim 1, wherein the contact plate comprises the first material and the wire connection portion comprises a second material having a third CTE within 20% of a fourth CTE of the wire.

12. The substrate support of claim 11, wherein the first material is a tungsten alloy and the second material is copper.

13. The substrate support of claim 11, wherein the contact plate and the wire connection portion are brazed together.

14. The substrate support of claim 11, wherein the contact plate and the wire connection portion are brazed together using silver.

15. The substrate support of claim 1, further comprising a plurality of spacers arranged on an upper contact surface of the contact plate.

16. A substrate support for a substrate processing system, the substrate support including a connection terminal for a heating element of the substrate support, the connection terminal comprising:
   a contact plate, wherein the contact plate is electrically connected to a contact pad of the heating element within a ceramic layer of the substrate support; and
   a wire connection portion extending from the contact plate, wherein the wire connection portion receives and retains a wire arranged to provide electrical power to the heating element,
   wherein the connection terminal comprises a functional-graded material (FGM) having a coefficient of thermal expansion (CTE) gradient from a ceramic-layer-side of the connection terminal to a wire-side of the connection terminal.

17. The substrate support connection terminal of claim 16, wherein a CTE of the FGM increases from the ceramic-layer-side of the connection terminal to the wire-side of the connection terminal.

18. The substrate support connection terminal of claim 16, wherein the FGM comprises a first CTE at the ceramic-layer-side of the connection terminal and a second CTE at the wire-side of the connection terminal, wherein the first CTE is within 20% of a third CTE of the ceramic layer, and wherein the second CTE is within 20% of a fourth CTE of the wire.

19. The substrate support of claim 16, wherein the FGM comprises tungsten and at least one of copper and molybdenum.

* * * * *